(12) United States Patent
Chen

(10) Patent No.: US 8,059,426 B2
(45) Date of Patent: Nov. 15, 2011

(54) ELECTROSTATIC GUIDING DEVICE ACHIEVED BY USING METAL SPUTTERING AND PLASTIC CASE

(75) Inventor: Yu-Hung Chen, Taipei (TW)

(73) Assignee: Inventec Corp., Taipei (TW)

( * ) Notice: Subject to any disclaimer, the term of this patent is extended or adjusted under 35 U.S.C. 154(b) by 369 days.

(21) Appl. No.: 12/503,980

(22) Filed: Jul. 16, 2009

(65) Prior Publication Data
US 2010/0015371 A1    Jan. 21, 2010

(30) Foreign Application Priority Data

Jul. 18, 2008  (TW) .............................. 97127491 A

(51) Int. Cl.
*H01R 4/66* (2006.01)

(52) U.S. Cl. ........ 361/799; 174/377; 438/286; 429/483; 428/697

(58) Field of Classification Search .................. 174/388, 174/565, 36, 378, 363, 377, 256, 260, 359; 438/197, 104, 108, 286, 318; 361/818, 505, 361/679.41, 760, 752, 679.34, 705, 821, 361/816; 429/62, 483, 209; 428/690, 697, 428/35.9
See application file for complete search history.

(56) References Cited

U.S. PATENT DOCUMENTS 6,624,353 B2 *   9/2003   Gabower ...................... 174/388
7,078,283 B1 *   7/2006   Wang ............................ 438/197

* cited by examiner

*Primary Examiner* — Hung Duong
(74) *Attorney, Agent, or Firm* — James W. Huffman

(57) ABSTRACT

An electrostatic discharge guide using metal sputtering process and modifying plastic case is applied to an electronic device. The plastic case and a metal case are laminated. The plastic case is defined with a tip portion spaced from the metal case on side wall thereof. A conductive layer formed on the surface of the plastic case opposite to the metal case extends to the tip of the tip portion, and is electrically connected to a ground of the electronic device. Therefore, when electrostatic charges accumulated on the metal case exceed a specific value, the static electricity is discharged to the ground of the electronic device based on the point discharge principle, instead of causing an electric shock to a user.

10 Claims, 9 Drawing Sheets

ELECTROSTATIC GUIDING DEVICE ACHIEVED BY USING METAL SPUTTERING AND PLASTIC CASE

CROSS-REFERENCE TO RELATED APPLICATIONS

This non-provisional application claims priority under 35 U.S.C. §119(a) on Patent Application No(s). 097127491 filed in Taiwan, R.O.C. on Jul. 18, 2008 the entire contents of which are hereby incorporated by reference.

BACKGROUND

1. Field of Invention

The present invention relates to a technique of eliminating static electricity, and more particularly to an electrostatic discharge guide using metal sputtering process and modifying plastic case.

2. Related Art

In order to meet demands of various appearance designs, different materials, such as metal or plastics, are generally adopted to fabricate the case of an electronic device. In addition, as for the design of fabricating the housing of an electronic device with metal, usually the metal housing is directly electrically connected to a ground terminal of an electronic component inside the device, so as to successfully release the static electricity from a ground terminal of the electronic device. The above manner may not cause any problem in non-portable electronic devices. However, when the same manner is applied to a portable electronic device, due to the current leakage of the electronic component, the user may feel an electric shock when directly contacting the housing of the electronic device. Further, the electrostatic protection should be considered during the design of a portable electronic device. That is, under a particular electrostatic shock (impact) test, the portable electronic device still works normally. Therefore, in the above design (the metal case of the portable electronic device is electrically connected to a ground area of the electronic component), during the electrostatic test, after striking on the metal case, a static electricity of 8 KV is immediately guided to the ground terminal of the electronic component. In this manner, a transient high voltage will directly impact on the electronic component, and thus the electronic component needs to be designed with more protections.

In order to solve the problem of current leakage of the electronic component, in some methods, a plastic case is added between the metal case and the electronic component, so as to electrically insulate the two. Although the above method prevents the user from being electrically shocked by the leakage current of the electronic component, the metal case does not have any ground mechanism, such that the metal case accumulates static electricity when held by the user for a long time or obtains an electrostatic value for absorbing the static electricity from the nature. At this time, when the user again contacts the electronic device, a potential difference exists between the electrostatic value of the user and the electrostatic value of the metal case, and thus the user may feel an electric shock.

SUMMARY OF THE INVENTION

Accordingly, in order to meet the demand of employing a metal material to fabricate the housing of an electronic device without causing the user to be electrically shocked, and also satisfy the electrostatic discharge specification, the present invention is directed to an electrostatic discharge guide using metal sputtering process and modifying plastic case.

An electrostatic discharge guide using metal sputtering process and modifying plastic case includes a metal case, a plastic case, and a conductive layer.

The plastic case and the metal case are laminated, and the conductive layer is located at the side of the plastic case opposite to the metal case.

The plastic case includes a main portion and a tip portion. The tip portion is disposed on a side wall of the main portion.

A first surface and a second surface of the main portion are opposite to each other, and a third surface of the main portion is connected between the first surface and the second surface of the main portion. The first surface of the main portion contacts the metal case, and the tip portion is located on the third surface of the main portion.

The tip portion has at least one tip, and the tip is spaced by a specific distance from the metal case. The conductive layer extends to the tip of the tip portion. The conductive layer may be electrically connected to a ground of the electronic device applying the present invention.

The tip portion may be protruded from or depressed below the third surface of the main portion. Further, the tip of the tip portion is formed by connecting any two neighboring side edges of an upper surface of the tip portion.

The tip portion and the main portion are integrally formed by plastic injection molding.

The conductive layer may be a metal sputtering layer. The metal sputtering layer may be a conductive coated film. The coated film may be formed by metal evaporation, metal water plating, vacuum sputtering, or other forms of processing methods. In addition, the conductive layer may also be a metal sheet.

An included angle of the tip portion may be smaller than 180 degrees. The specific distance is a height from the tip of the tip portion to the metal case, and is between 0.1 mm and 20 mm. In addition, the tip of the tip portion is preferably spaced from the metal case by a distance at least above 0.1 mm.

When the electrostatic discharge guide using metal sputtering process and modifying plastic case of the present invention is applied to an electronic device, and the static electricity accumulated by the metal case of the electronic device exceeds a specific value, electrostatic charges may jump from the metal case to the conductive layer on the tip portion of the plastic case, and are then guided to the ground through the conductive layer. Thereby, the electrostatic charges are successfully grounded without causing an electric shock to the user. Meanwhile, the metal housing is not electrically connected to the electronic component, and thus the current leakage may not occur.

In view of the above, the electrostatic discharge guide using metal sputtering process and modifying plastic case provided by the present invention is mainly constituted by a case having an insulating tip portion and a conductive layer design. The electrostatic charges accumulated on the metal case are guided to the conductive layer through the tip of the tip portion, and then released by grounding the conductive layer. As such, the demand of employing a metal material to fabricate the housing of an electronic device without causing the user to be electrically shocked is fulfilled, and the electrostatic discharge specification is satisfied.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The detailed features and advantages of the present invention will be described in detail in the following embodiments. Those skilled in the arts can easily understand and implement the content of the present invention. Furthermore, the relative objectives and advantages of the present invention are apparent to those skilled in the arts with reference to the content disclosed in the specification, claims, and drawings. The embodiments below are intended to further describe the views of the present invention instead of limiting the scope of the same.

Figure 1:
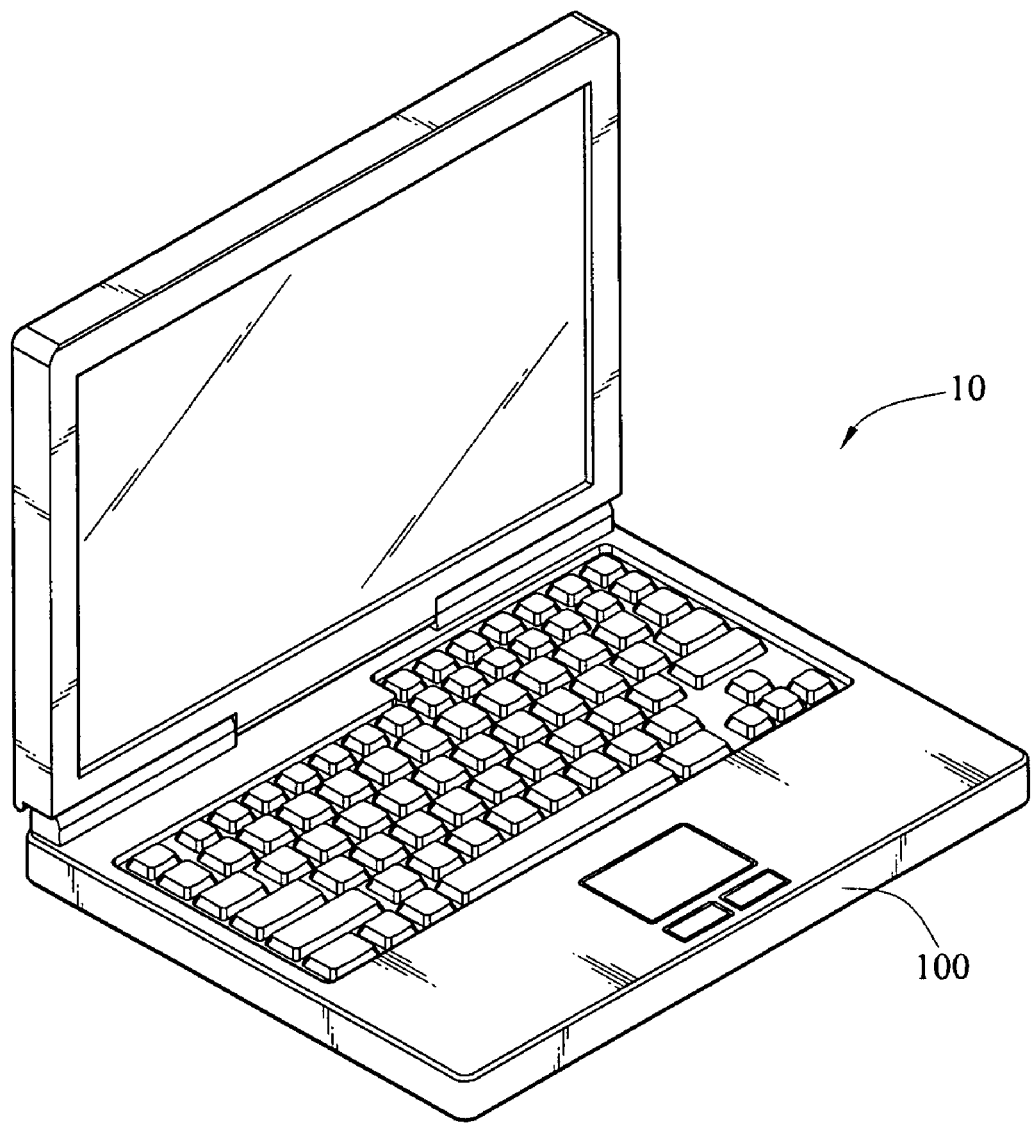
FIG. 1 is a schematic three-dimensional view of an electrostatic discharge guide using metal sputtering process and modifying plastic case according to an embodiment of the present invention.
Figure 2:
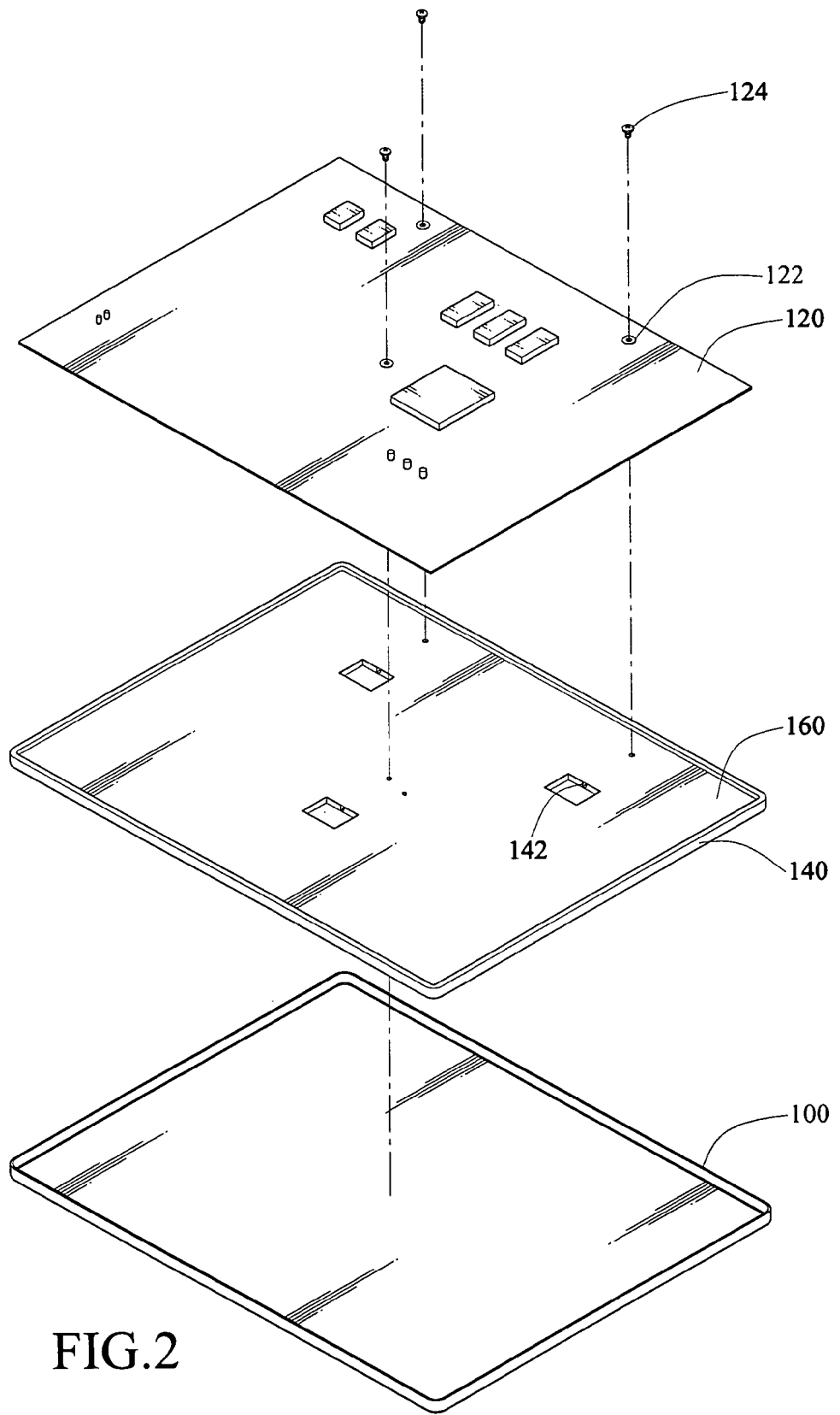
FIG. 2 is a schematic three-dimensional exploded view of an electrostatic discharge guide using metal sputtering process and modifying plastic case according to an embodiment of the present invention.

Referring to FIGS. 1 and 2, a schematic three-dimensional view and a schematic three-dimensional exploded view of an electrostatic discharge guide using metal sputtering process and modifying plastic case according to an embodiment of the present invention are shown.

The electrostatic discharge guide using metal sputtering process and modifying plastic case includes a metal case 100, a plastic case 140, and a conductive layer 160.

The electrostatic discharge guide using metal sputtering process and modifying plastic case may be applied to an electronic device 10. The electronic device 10 is, but not limited to, a computer, a portable electronic device, a server, a notebook computer, a personal digital assistant, a mobile phone, or any other electronic information apparatus. The electronic device 10 has an electronic component 120 for performing electronic functions of the electronic device 10.

In brief, the electronic component 120 may be, but not limited to, a circuit board with various electronic elements and electrical connection lines, such that the electronic functions of the electronic device 10 are provided through the cooperation of the electrically connected electronic elements.

The plastic case 140 is accommodated in the metal case 100, and the electronic component 120 is accommodated in the plastic case 140. The conductive layer 160 is located on a surface of the plastic case 140. In other words, the plastic case 140 is sandwiched between the metal case 100 and the electronic component 120. Referring to FIGS. 1 and 2, seen from the partial cross-sectional structure of the electronic device 10, the plastic case 140 is located on the metal case 100, and the electronic component 120 of the electronic device 10 is located on the plastic case 140. That is, the plastic case 140 and the metal case 100 are laminated, and the electronic component 120 of the electronic device 10 is located at the side of the plastic case 140 opposite to the metal case 100.

The conductive layer 160 covers a surface of the plastic case 140 opposite to the metal case 100 (that is, the other surface of the plastic case 140 opposite to the surface of the plastic case 140 contacting the metal case 100). The conductive layer 160 is electrically connected to the ground of the electronic device 10.

Referring to FIGS. 3A, 3B, 4, 5, 6, and 7, the plastic case 140 is disposed between the metal case 100 and the electronic component 120. The plastic case 140 has a main portion 141 and a tip portion 142 (also called as a discharge portion). A first surface 141a of the main portion 141 of the plastic case 140 abuts on (contacts) the metal case 100. The first surface 141a and a second surface 141b of the main portion 141 are opposite to each other, and a third surface 141c of the main portion 141 is connected between the first surface 141a and the second surface 141b of the main portion 141. The tip portion 142 is located on a side of the plastic case 140, that is, on the third surface 141c of the main portion 141. The conductive layer 160 is formed on a surface of the tip portion 142, that is, the surface of the tip portion 142 opposite to the metal case 100. The conductive layer 160 may completely or partially cover the upper surface 142a of the tip portion 142, but at least extends to the tip of the tip portion 142.

The tip (also called as a discharge point) of the tip portion 142 extends away from the third surface 141c of the main portion 141, and is spaced from the metal case 100 by a specific distance H. In other words, the conductive layer 160 is not electrically connected to the metal case 100.

Here, the specific distance H is a height from the tip of the tip portion 142 to the surface of the metal case 100, and is between 0.1 mm and 20 mm. In addition, the tip of the tip portion 142 is preferably spaced from the metal case 100 by a distance at least above 0.1 mm.

Here, an included angle of the tip portion 142 (that is, an included angle of the tip) may be smaller than 180 degrees, and is preferably an acute angle.

Figure 4:
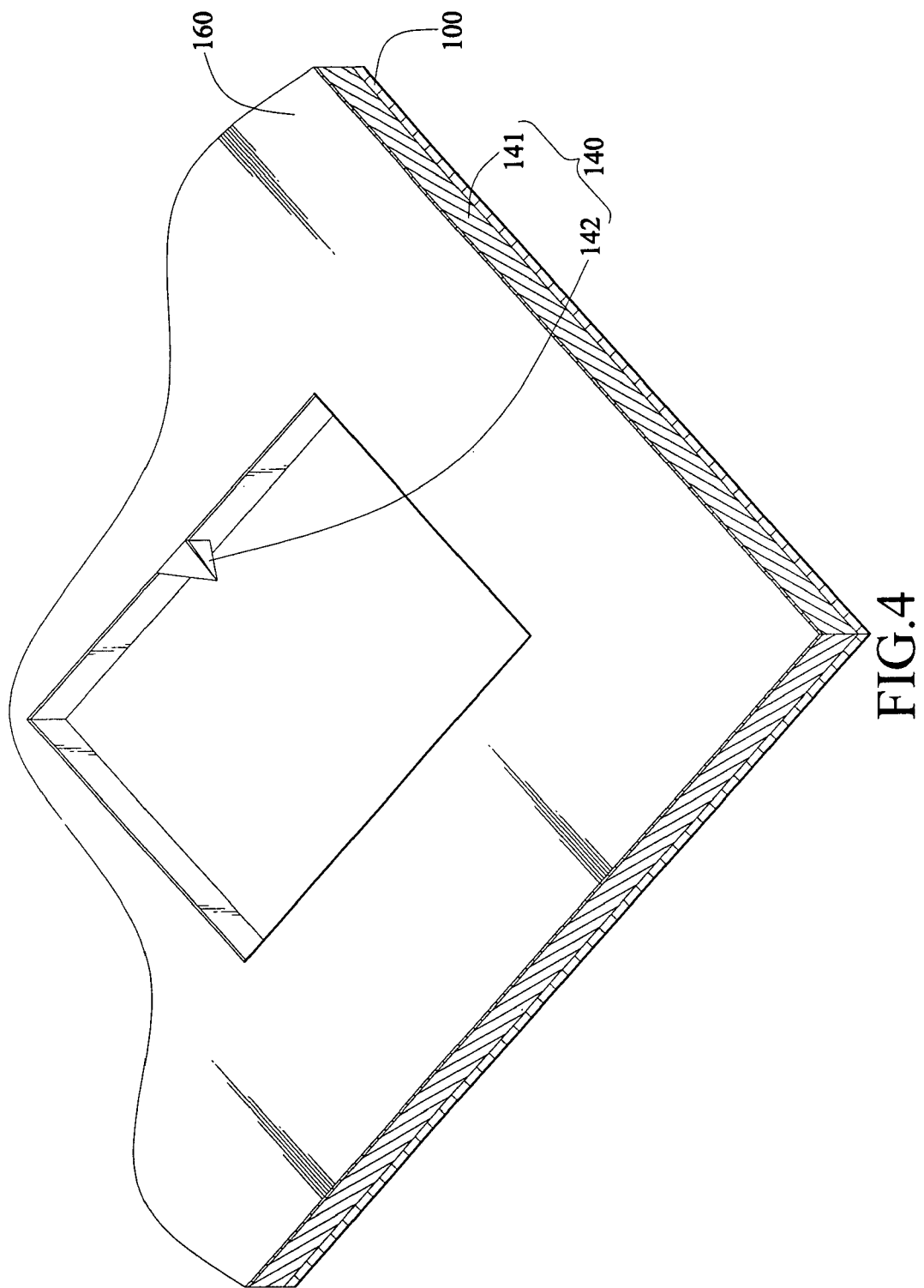
FIG. 4 is a partial top view of an electrostatic discharge guide using metal sputtering process and modifying plastic case according to a first embodiment of the present invention.
Figure 5:
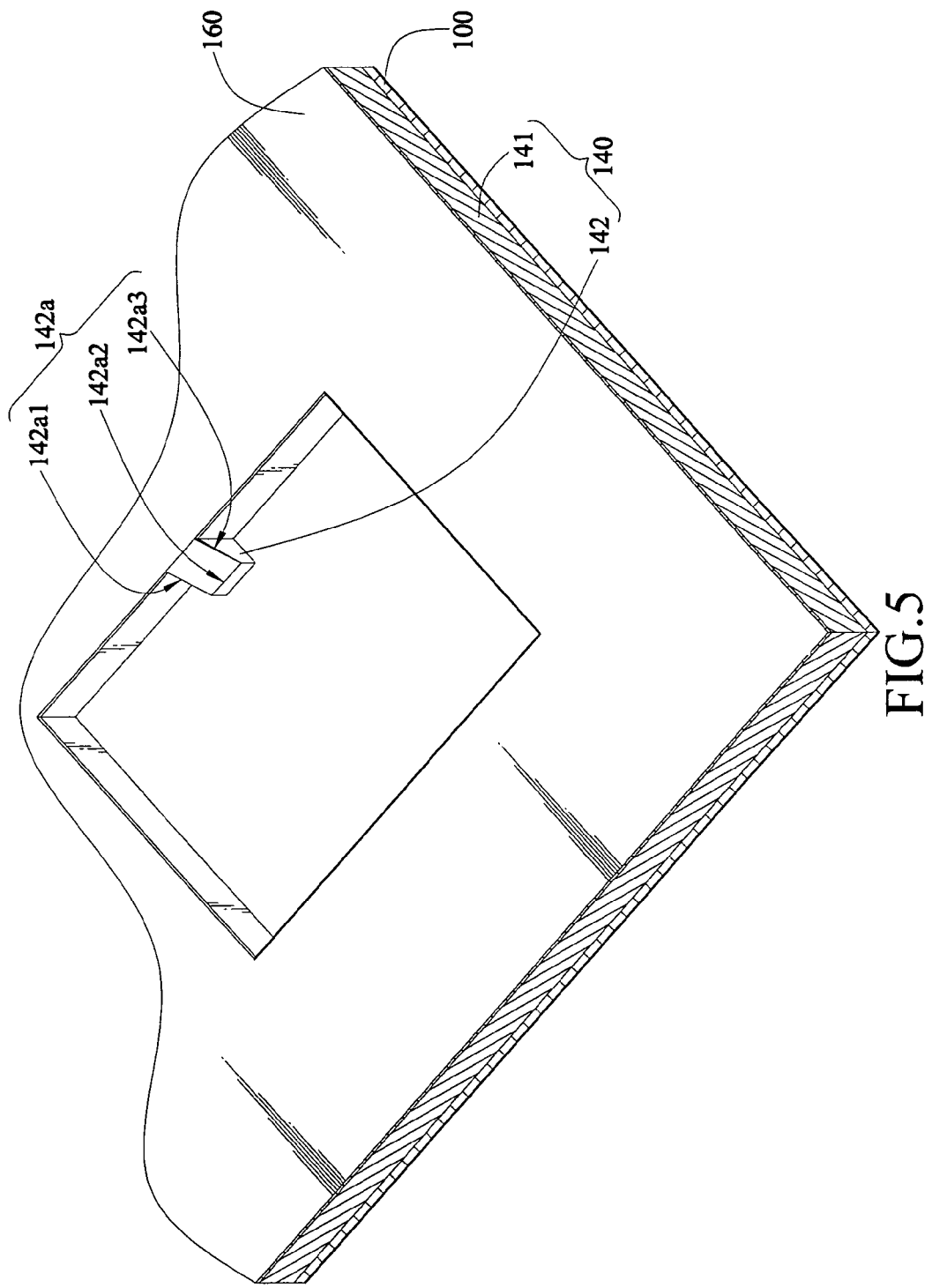
FIG. 5 is a partial top view of an electrostatic discharge guide using metal sputtering process and modifying plastic case according to a second embodiment of the present invention.
Figure 6:
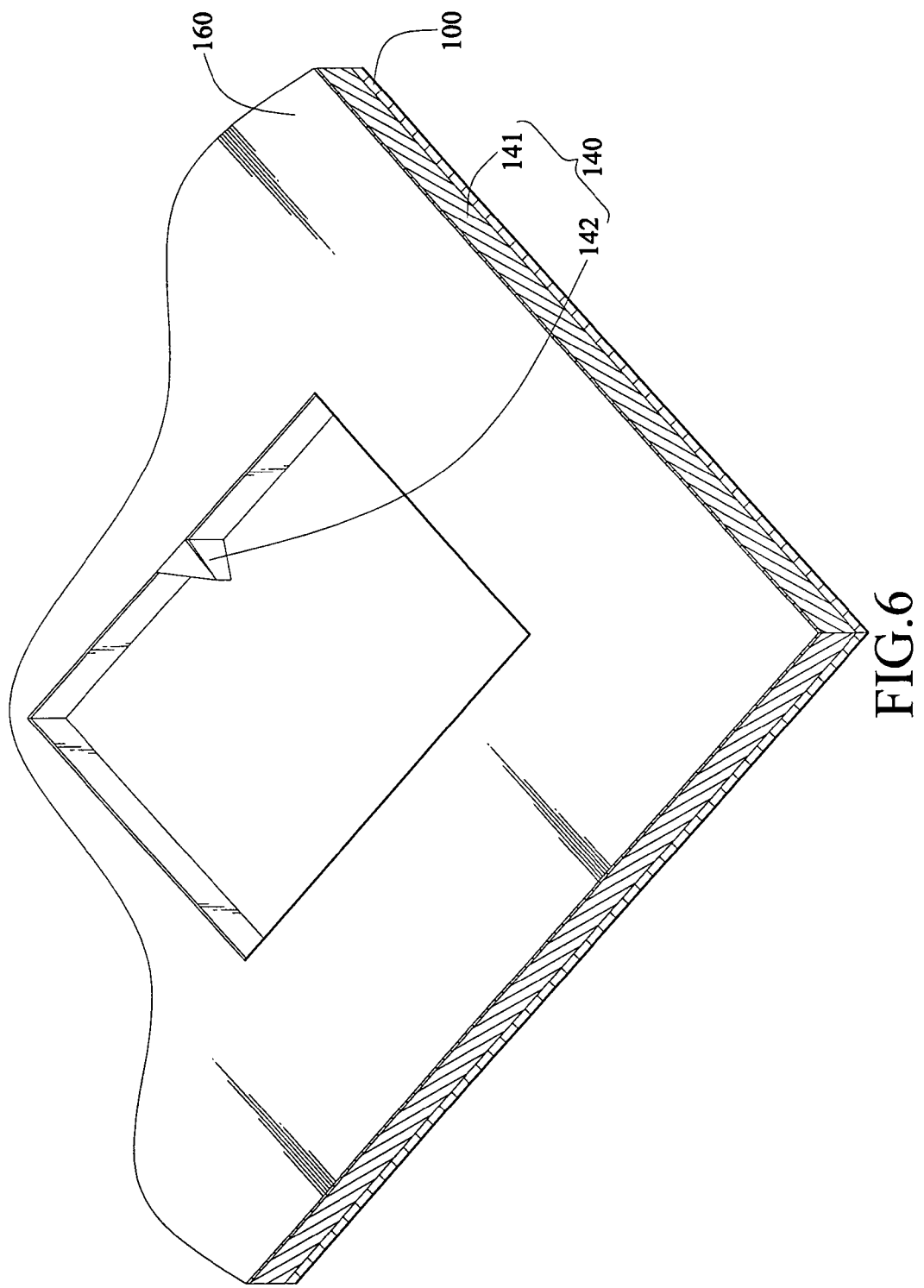
FIG. 6 is a partial top view of an electrostatic discharge guide using metal sputtering process and modifying plastic case according to a third embodiment of the present invention.

The tip portion 142 may be protruded from the side edge of the plastic case 140, that is, protruded from the third surface 141c of the main portion 141, as shown in FIGS. 4, 5, and 6. In addition, the tip portion 142 may also be depressed below the side edge of the plastic case 140, that is, depressed below the third surface 141c of the main portion 141, as shown in FIG. 7.

Figure 3A:
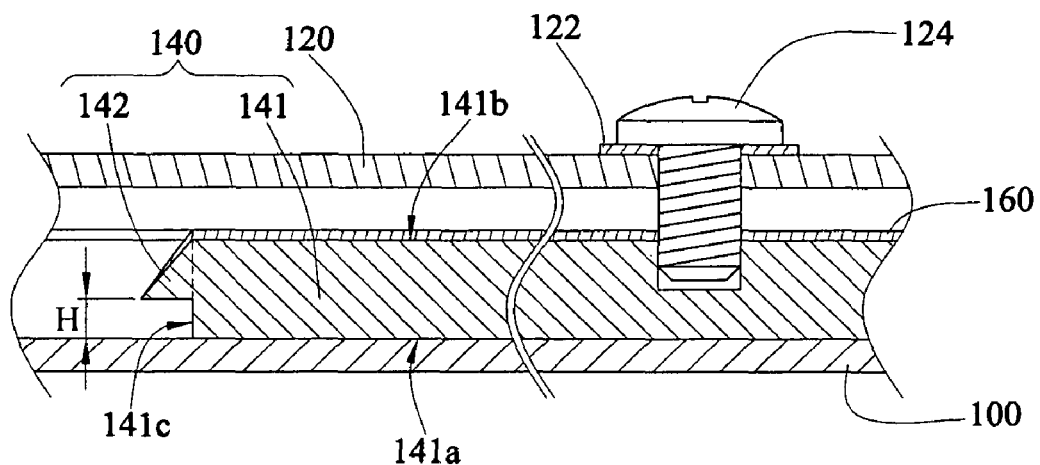
FIG. 3A is a schematic partial cross-sectional view of an electrostatic discharge guide using metal sputtering process and modifying plastic case according to an embodiment of the present invention.
Figure 7:
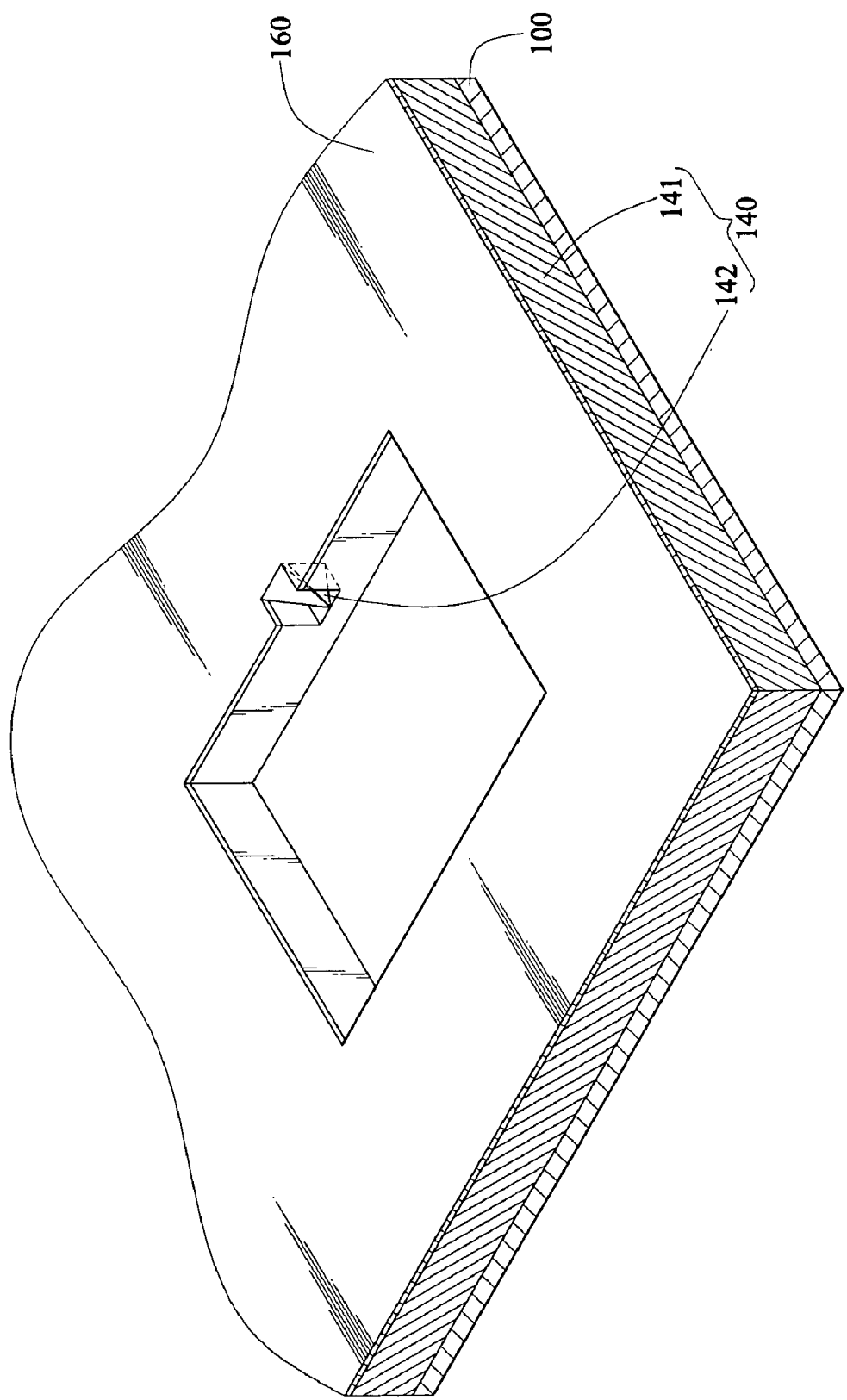
FIG. 7 is a partial top view of an electrostatic discharge guide using metal sputtering process and modifying plastic case according to a fourth embodiment of the present invention.
Figure 8:
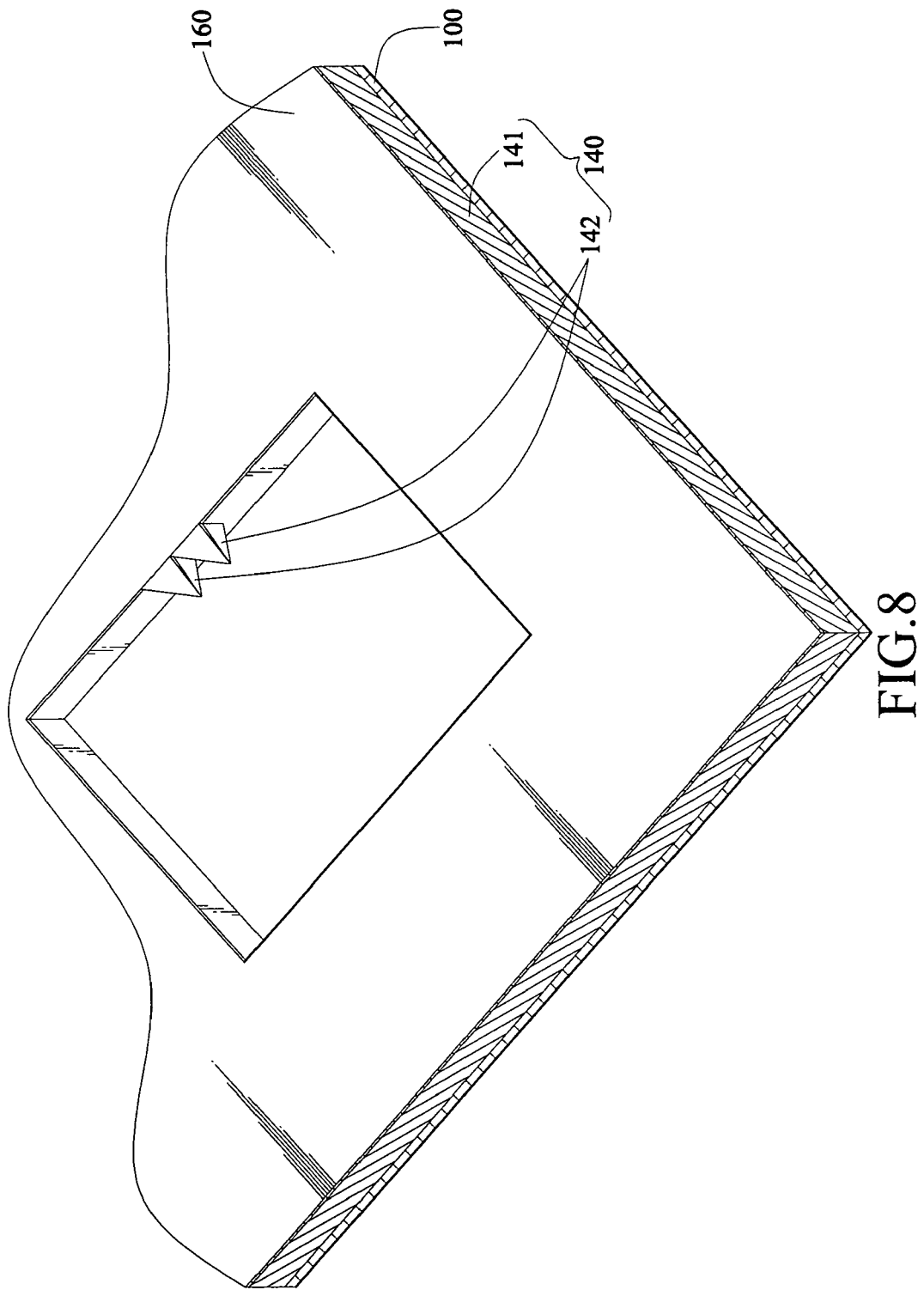
FIG. 8 is a partial top view of an electrostatic discharge guide using metal sputtering process and modifying plastic case according to a fifth embodiment of the present invention.
Figure 9:
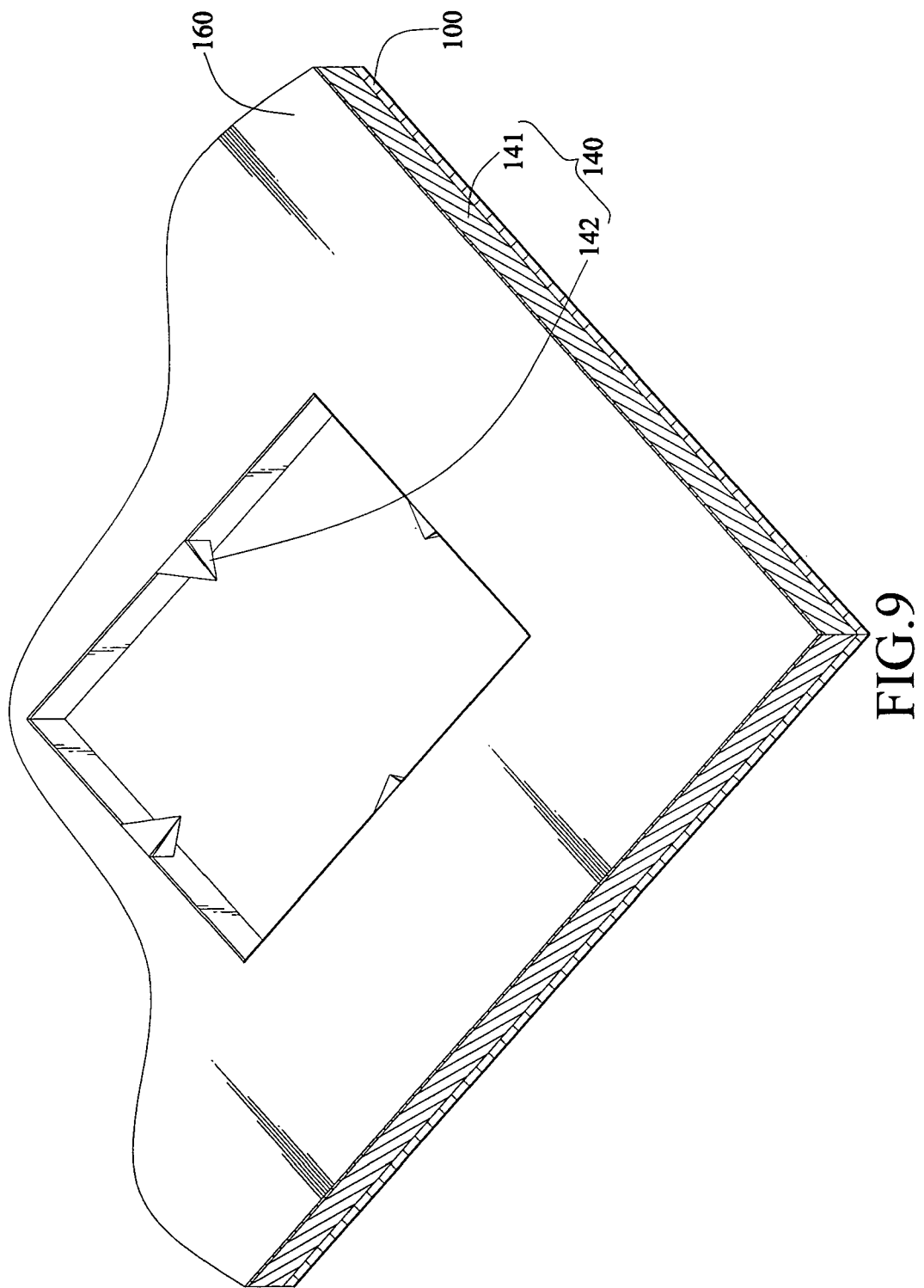
FIG. 9 is a partial top view of an electrostatic discharge guide using metal sputtering process and modifying plastic case according to a sixth embodiment of the present invention.

Here, a lower surface of the tip portion 142 may be separated from the surface of the metal case 100, as shown in FIGS. 3A, 4, and 7. Besides, the lower surface of the tip portion 142 may also be designed to contact the surface of the metal case 100, as shown in FIGS. 3B, 5, and 6.

Further, the tip portion 142 may be designed to have one tip, that is, the tip portion 142 is converged to a point in a direction away from the third surface 141c of the connected main portion 141, so as to form a triangular upper surface (the surface of the tip portion 142 opposite to the metal case 100), as shown in FIGS. 4, 6, and 7. The tip portion 142 may also be designed to have an upper surface in the shape of a quadrangle (i.e., rectangle), a pentagon, or a polygon with more sides. In other words, more than two tips are formed by connecting any two neighboring side edges 142a1 and 142a2 or 142a2 and 142a3 (except for the side edge connecting the third surface 141c of the main portion 141) of the upper surface 142a, as shown in FIG. 5.

The tip portion 142 and the main portion 141 of the plastic case 140 may be integrally formed by plastic injection molding. The number of the tip portion 142 may be set according to practical requirements. In other words, one, two, three, four, five, or above tip portions 142 may be disposed on the plastic case 140, as shown in FIGS. 4, 5, 6, 7, 8, and 9.

Figure 3B:
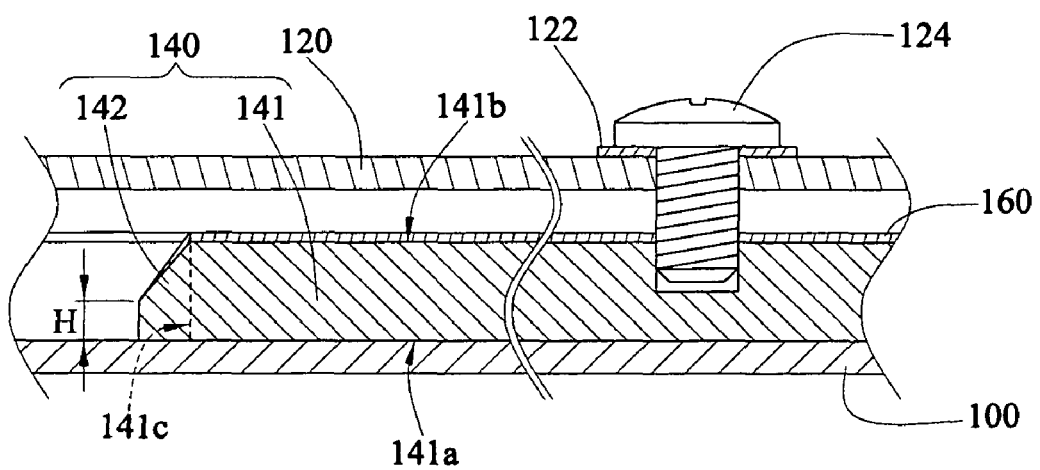
FIG. 3B is a schematic partial cross-sectional view of an electrostatic discharge guide using metal sputtering process and modifying plastic case according to another embodiment of the present invention.

In addition, referring to FIGS. 2, 3A, and 3B, the electronic component 120 has a ground area 122, and the conductive layer 160 is electrically connected to the ground area 122. The ground area 122 may be a ground layer of the circuit board or a ground contact of the surface.

Here, the conductive layer 160 is electrically connected to the ground area 122 of the electronic component 120 (for example, the ground of the electronic device 10) through a conductive screw 124, such that the ground area 122 of the electronic component 120 extends to the conductive layer 160, and thus the conductive layer 160 is grounded.

The conductive layer 160 may be formed on an inner surface of the plastic case 140 (that is, the second surface 141b of the main portion 141) and covering the surface of the tip portion 142 (that is, the surface of the tip portion 142 facing the electronic component 120, or the surface of the tip portion 142 opposite to the metal case).

The conductive layer 160 may be a metal sputtering layer. The metal sputtering layer may be a conductive coated film. The coated film may be formed by metal evaporation, metal water plating, vacuum sputtering, or other forms of processing methods. The material of the plastic case 140, except for the conductive layer 160, may be a metal material capable of being sputtered, for example, but not limited to, PET plastic. In addition, the conductive layer may also be a metal sheet, for example, but not limited to, aluminum foil or copper foil.

Here, an experiment is performed on the electronic device 10 applying the structure as shown in FIG. 4. There are mainly two experimental items, one is an electrostatic test, and the other is a current leakage test.

When the electrostatic test is performed by a test man on an electrostatic testing instrument, first, the electronic device 10 is started to operate, and an electrostatic discharge value is adjusted to 8 KV. A testing rod of the testing instrument is made to directly contact the metal case, and then the electrostatic testing instrument is started to make the static electricity discharged on the metal case 100 through the testing rod. Afterward, it is inspected whether the electronic device 10 operates normally, and it is also detected whether any residual electrostatic charges are left on the metal case 100. Till then, the electrostatic test as the first item is finished.

The electrostatic test of the second item is performed in the same way as the electrostatic test of the first item, except that the adopted electrostatic discharge value is 15 KV, and the inspected and detected items after the test are identical to the above.

After the electrostatic tests of the first and second items, when the electrostatic discharge values are 8 KV and 15 KV, and the specific distance between the tip of the tip portion 142 and the metal case 100 is 0.1 mm or 0.3 mm, the test result (i.e., the residual quantity of the electrostatic charges and the operation condition of the electronic device 10) is "pass", and when the specific distance is larger than 20 mm, the test result is "fail".

Further, for the current leakage test, mainly an electronic component capable of intentionally generating a leakage current is disposed in the electronic device 10 applying the present invention, so as to form the current leakage phenomenon, and then it is detected whether the current is leaked to the user from the metal case 100. Through the test, if the conductive layer 160 on the tip portion 142 is electrically connected to the metal case 100, the current leakage may occur, that is, the test result is "fail", and when the specific distance is larger than 0.1 mm, the test result is "pass".

Practically, the specific distance between the tip of the tip portion 142 and the metal case 100 for achieving the electrostatic guiding effect may vary according to the electrostatic discharge voltage. Therefore, as long as a minute distance is kept between the tip of the tip portion 142 and the metal case 100 without making the conductive layer 160 on the tip portion 142 directly contact the metal case 100, the electrostatic guiding effect may be generated, and the current leakage may also be prevented.

When the electrostatic discharge guide using metal sputtering process and modifying plastic case provided by the present invention is applied to the electronic device 10, the metal case 100 serves as an outer case of the electronic device 10, the plastic case 140 serves as an inner case of the electronic device 10, and the electronic component 120 of the electronic device 10 is accommodated in the plastic case 140.

When the electrostatic amount accumulated on the metal case 100 exceeds a specific value, the electrostatic charges may jump from the metal case 100 to the tip portion of the plastic case 140, and are then guided to the ground of the electronic device 10. Thereby, the electrostatic charges can be successfully grounded without causing an electric shock to the user. Meanwhile, the metal housing (i.e., the metal case 100) is not electrically connected to the electronic component 120, and thus the current leakage may not occur.

In view of the above, the electrostatic discharge guide using metal sputtering process and modifying plastic case provided by the present invention is mainly constituted by a case having an insulating tip portion and a conductive layer design. The electrostatic charges accumulated on the metal case are guided to the conductive layer through the tip of the tip portion, and then released by grounding the conductive layer.

What is claimed is:

1. An electrostatic discharge guide using metal sputtering process and modifying plastic case, comprising:
   a metal case;
   a plastic case, located on the metal case, and comprising:
   a main portion, having:
   a first surface, contacting the metal case;
   a second surface, opposite to the first surface; and
   a third surface, connected between the first surface and the second surface; and
   a tip portion, located on the third surface of the main portion, and having at least one tip, wherein the tip is spaced by a specific distance from the metal case; and
   a conductive layer, located on the side of the plastic case opposite to the metal case, and extending to the tip.

2. The electrostatic discharge guide using metal sputtering process and modifying plastic case according to claim 1, wherein the tip portion is protruded from the third surface of the main portion.

3. The electrostatic discharge guide using metal sputtering process and modifying plastic case according to claim 1, the tip portion is depressed below the third surface of the main portion.

4. The electrostatic discharge guide using metal sputtering process and modifying plastic case according to claim 1, wherein the tip of the tip portion is formed by connecting any two neighboring side edges of an upper surface of the tip portion.

5. The electrostatic discharge guide using metal sputtering process and modifying plastic case according to claim 1, wherein the conductive layer is a metal sputtering layer.

6. The electrostatic discharge guide using metal sputtering process and modifying plastic case according to claim 1, wherein the conductive layer is a metal sheet.

7. The electrostatic discharge guide using metal sputtering process and modifying plastic case according to claim 1, wherein the specific distance is from 0.1 mm to 20 mm.

8. The electrostatic discharge guide using metal sputtering process and modifying plastic case according to claim 1, wherein an included angle of the tip portion is smaller than 180 degrees.

9. The electrostatic discharge guide using metal sputtering process and modifying plastic case according to claim 8, wherein the included angle of the tip portion is an acute angle.

10. The electrostatic discharge guide using metal sputtering process and modifying plastic case according to claim 1, wherein the main portion and the tip portion are integrally formed.

* * * * *